US008258802B2

(12) United States Patent
Yaguchi et al.

(10) Patent No.: US 8,258,802 B2
(45) Date of Patent: Sep. 4, 2012

(54) TEST APPARATUS AND TEST METHOD

(75) Inventors: Takeshi Yaguchi, Saitama (JP); Mamoru Hiraide, Saitama (JP)

(73) Assignee: Advantest Corporation, Tokyo (JP)

( * ) Notice: Subject to any disclaimer, the term of this patent is extended or adjusted under 35 U.S.C. 154(b) by 310 days.

(21) Appl. No.: 12/694,151

(22) Filed: Jan. 26, 2010

(65) Prior Publication Data

US 2011/0181310 A1    Jul. 28, 2011

(51) Int. Cl.
*G01R 31/3187* (2006.01)

(52) U.S. Cl. ............... 324/750.3; 324/762.01; 324/537; 324/73.1; 714/724; 714/733

(58) Field of Classification Search .............. 324/750.3, 324/762.01, 73.1, 537; 714/724, 733–734
See application file for complete search history.

(56) References Cited

U.S. PATENT DOCUMENTS

| 6,028,439 A * | 2/2000 | Arkin et al. ............ 324/762.02 |
| 2011/0015890 A1 * | 1/2011 | Yamashita et al. ........... 702/120 |

FOREIGN PATENT DOCUMENTS

| JP | 9-89999 A | 4/1997 |
| JP | 2001-522049 A | 11/2001 |
| JP | 2002-131397 A | 5/2002 |
| JP | 2008-122212 A | 5/2008 |
| WO | 9923499 A1 | 5/1999 |

OTHER PUBLICATIONS

Evans, "The New ATE: Protocol Aware", Test Conference, IEEE International, Oct. 2007, pp. 1-10, Santa Clara, CA.
Applicants bring the attention of the Examiners to the following U.S. Appl. No. 12/694,154, filed Jan. 26, 2010.
Japanese Office Action dated Mar. 22, 2011, in a counterpart Japanese patent application JP2011-013399, citing Foreign Patent document No. 1 listed above and JP2008-122212 which has been submitted in a previous IDS. Partial translation of the Office Action is attached as a concise explanation of relevance.

* cited by examiner

*Primary Examiner* — Arleen M Vazquez
(74) *Attorney, Agent, or Firm* — Chen Yoshimura LLP

(57) ABSTRACT

Provided is a test apparatus for testing a device under test, including: a plurality of test modules that exchange signals with the device under test; a bus to which the plurality of test modules are connected; and a test control section that controls the plurality of test modules via the bus, where each of the plurality of test modules includes: a test section that exchanges signals with the device under test, and a module control section that controls the test section, and the module control section of each test module exchanges signals with the module control section of another test module, via the bus.

7 Claims, 9 Drawing Sheets

TEST APPARATUS AND TEST METHOD

BACKGROUND

1. Technical Field

The present invention relates to a test apparatus and a test method.

2. Related Art

An apparatus having a plurality of test modules, a tester bus, and a tester controller is known as a test apparatus to test a device under test such as a semiconductor circuit (e.g., see Patent Document No. 1). The tester controller controls the plurality of test modules via a tester bus, to test a device under test. Patent Document No. 1: Japanese Patent Application Publication No. 9-89999

A plurality of test modules for testing a same device under test are desirably operated in synchronization. Conventional test apparatuses have controlled the synchronous operation of such a plurality of test modules by means of a test controller. This is not preferable because it incurs a processing time at the side of the test controller.

SUMMARY

Therefore, it is an object of an aspect of the innovations herein to provide a test apparatus and a test method, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary apparatus and method is a test apparatus and a test method related to the test apparatus for testing a device under test, including: a plurality of test modules that exchange signals with the device under test; a bus to which the plurality of test modules are connected; and a test control section that controls the plurality of test modules via the bus, where each of the plurality of test modules includes: a test section that exchanges signals with the device under test, and a module control section that controls the test section, and the module control section of each test module exchanges signals with the module control section of another test module, via the bus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
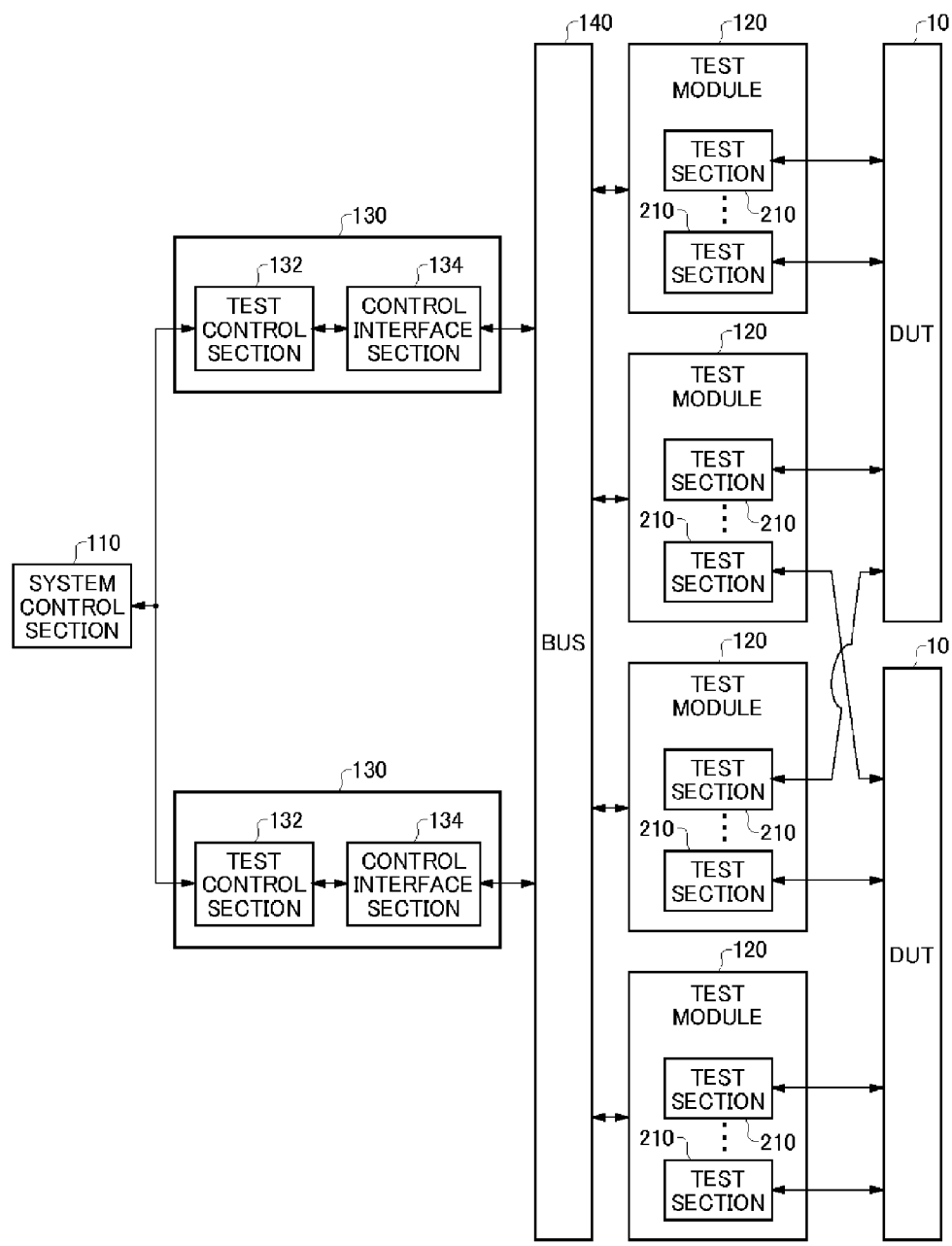
FIG. 1 shows a functional configuration of a test apparatus 100 together with a plurality of devices under test (DUT) 10.

FIG. 1 shows a functional configuration of a test apparatus 100 together with a plurality of devices under test (DUT) 10. The test apparatus 100 tests at least one device under test 10. That is, the test apparatus 100 may test one device under test 10, or test a plurality of devices under test 10 in parallel.

The test apparatus 100 includes a system control section 110, a plurality of test modules 120, a plurality of site control sections 130, and a bus 140. The system control section 110 is connected to the plurality of site control sections 130, to control the entire test apparatus 100. For example, a general-purpose or dedicated high-speed serial bus or the like is used to connect the system control section 110 and the plurality of site control sections 130.

Each site control section 130 is associated with one or more devices under test 10. Each site control section 130 controls one or more test modules 120, each test module being connected to a respective device under test 10, to control the test of the respective device under test 10.

Each site control section 130 controls a corresponding test module 120 in accordance with a control instruction, a test program, etc. supplied from the system control section 110. In other words, each site control section 130 uses one or more test sections 210 as a resource, to control the test of a corresponding device under test 10. The bus 140 connects a site control section 130 to one or more test modules 120.

The site control sections 130 may control the test modules 120, per each test section 210 included in each test module 120. For example, when part of the test sections 210 included in a test module 120 is connected to a first device under test 10, and the remaining test sections 210 are connected to a second device under test 10, a first site control section 130 may control the test sections 210 connected to the first device under test 10, and a second site control section 130 may control the test sections 210 connected to the second device under test 10. That is, a plurality of test sections 210 included in a single test module 120 may be classified into groups, so that each group be controlled by a respective one of site controllers 130.

A test module 120 exchanges signals with a corresponding device under test 10. Each test module 120 includes a plurality of test sections 210. Each test section 210 is connected to a terminal of any one of all the devices under test 10 to be tested by the test apparatus 100. Each of the plurality of test sections 210 exchanges signals with a device under test 10 connected thereto, and tests the device under test 10.

For example, a test module 120 may supply a test signal having a predetermined logical pattern to a device under test 10, and receive a signal representing a result of the device under test 10 operated according to the test signal. Each test module 120 may be provided on a substrate different from each other. Note that the plurality of test sections 210 provided for a same test module 120 are connected to the bus 140 via a common interface.

Here, the interface may set, for each of the corresponding test section 210, the site control section 130 to control the test section 210, independently from one another. For example, upon reception of an instruction from the bus 140, the interface may notify only the test section(s) 210 designated by the instruction, of the instruction, from among all the test sections 210.

In this way, the test apparatus 100 may arbitrarily set the site control section 130 to control each of a plurality of test sections 210 included in a single test module 120, independently from one another. In this way, the test apparatus 100 may conduct a test by efficiently using the resources in the test modules 120.

Each site control section 130 includes a test control section 132 and a control interface section 134. The test control section 132 executes a program for controlling a test of a device under test 10, and issues an instruction according to the execution result. The test control section 132 issues an instruction containing information for designating a test module 120 to which the instruction is to be directed.

For example, the test control section 132 may issue an instruction containing information for designating a device under test 10. The interface of each test module 120 may determine that the instruction designates itself, if a test section 210 belonging to itself is connected to the device under test 10 designated by the instruction.

The test control section 132 may also issue an instruction containing information for designating a test section 210 to which the instruction is to be directed. The interface of each test module 120 may determine that the instruction designates itself, if a test section 210 belonging to itself is designated by the instruction. Each test module 120 notifies the designated test section 210 of the instruction.

The test control section 132 may issue a read instruction for reading data, a write instruction for writing data, and other instructions. The test control section 132 may have a processor, a memory, or the like.

The control interface section 134 processes communication between the site control section 130 and the bus 140, according to control by the test control section 132. For example, upon reception of an instruction from the test control section 132, the control interface section 134 may transmit the instruction to the corresponding test module 120, or to all the test modules 120. The control interface section 134 transmits, to the test control section 132, the data received from each test module 120.

The test control section 132 issues a group read instruction for collectively reading the data stored by two or more test modules 120. The test control section 132 may designate a test module 120, a test section 210, or a device under test 10, by means of the group read instruction.

The control interface section 134 reads data from a test module 120 corresponding to the group read instruction. For example, the control interface section 134 may notify all the test modules 120 connected to the bus 140, of the group read instruction. Each test module 120 may notify a corresponding test section 210 of the group read instruction, when the received group read instruction designates the test module 120 itself.

The test module 120 designated by the group read instruction outputs, to the bus 140, the data stored in the address, the register, or the like designated by the group read instruction. During this operation, the test module 120 attaches information indicating that it is response data to the group read instruction, to the response data. For example, the test module 120 may attach tag information identifying the group read instruction from other instructions, to the response data.

The response data may be data indicating a state of a test module 120, such as data indicating whether each test module 120 is in wait state. The response data may also be data indicating a test result, for example on acceptability of a device under test 10.

Each control interface section 134 receives response data from a test module 120 via the bus 140. The control interface section 134 may abandon response data other than the response data in response to the group read instruction issued by the control interface section 134 itself. The control interface section 134, upon reception of response data from all the test modules 120 designated by the group read instruction, collectively notifies the test control section 132 of these pieces of response data. The control interface section 134 may notify the test control section 132 of logical OR or logical AND of these pieces of response data.

According to the stated configuration, the test control section 132 can collectively designate two or more test modules 120, and collectively read data. Consequently, the test results, the state of the test modules 120, or the like can be efficiently obtained.

The test control section 132 may control the plurality of test modules 120 based on the collectively read pieces of response data. For example, when all the designated test modules 120 are brought into wait state, the test control section 132 may supply these test modules 120 with a trigger signal for starting the next test. The test control section 132 may cause each test module 120 to execute a test item according to the test result in the designated test module 120.

Figure 2:
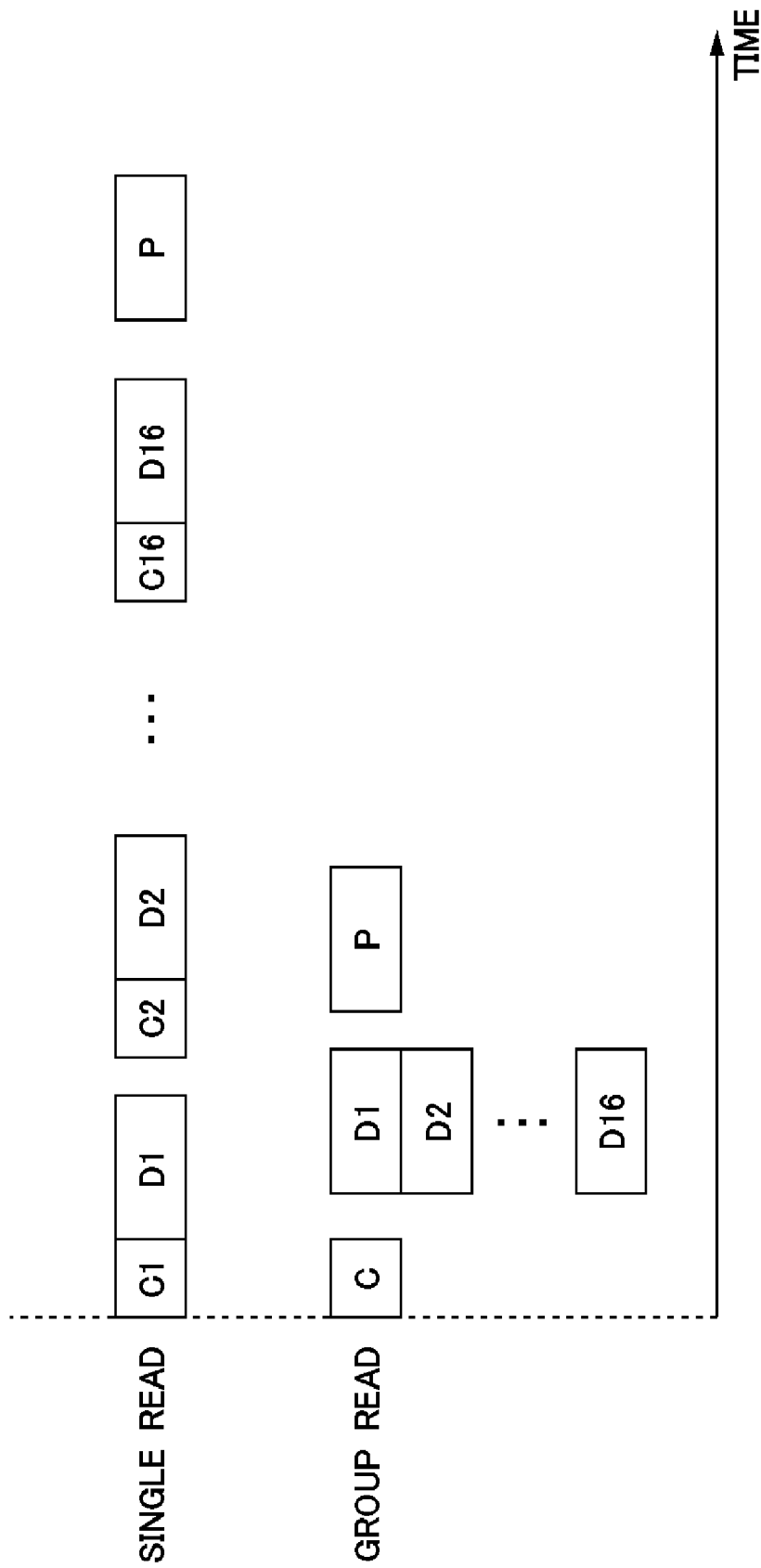
FIG. 2 shows an exemplary operation of a test control section 132.

FIG. 2 shows an exemplary operation of a test control section 132. This example deals with a case where the test control section 132 issues a single read instruction for reading data by designating the test modules 120 one by one, and a case where the test control section 132 issues the above-stated group read instruction. In FIG. 2, the symbol C represents a period during which the test control section 132 issues a read instruction, and the symbol D represents a period during which the test control section 132 receives response data, and the symbol P represents a period during which the test control section 132 processes the data.

When a single read instruction is used to read data from a plurality of test modules 120, after reception of response data from a test module 120, the test control section 132 issues a single read instruction to the next test module 120. Therefore, in proportion to the number of test modules 120, the time required for executing the single read instruction increases.

As opposed to this, when a group read instruction is used to read data from a plurality of test modules 120, the test control section 132 issues the group read instruction that collectively designates the plurality of test modules 120, and receives pieces of response data accumulated in the control interface section 134. When using a group read instruction in this manner, the data can be read from the plurality of test modules 120 in shorter time than in a case where a single read instruction is used.

Figure 3:
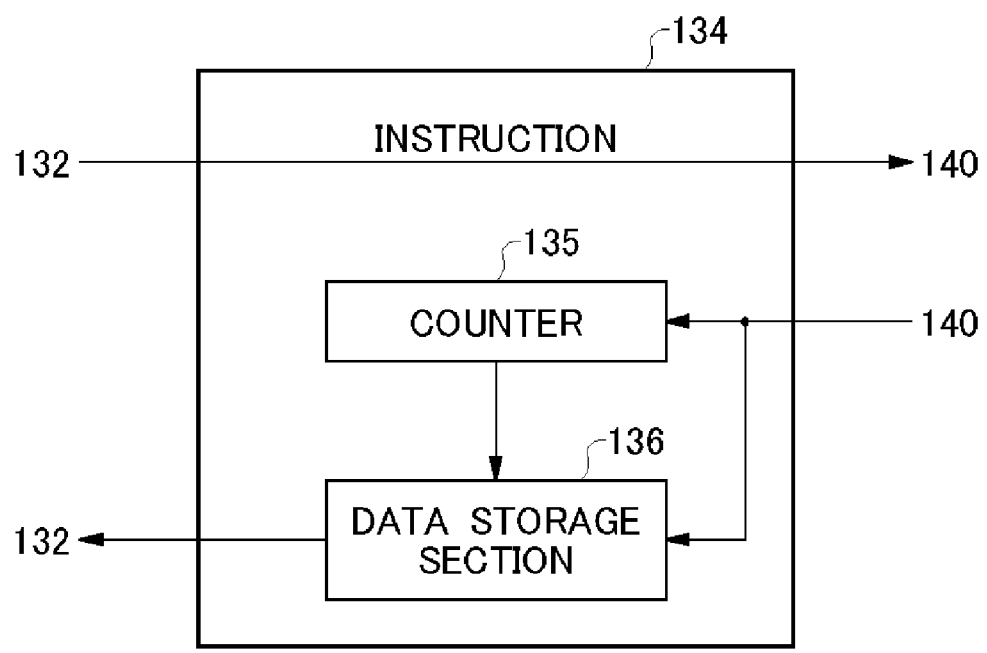
FIG. 3 shows an exemplary configuration of a part of a control interface section 134.

FIG. 3 shows an exemplary configuration of a part of a control interface section 134. The following explains only the configuration of the control interface section 134 that is used for processing response data read according to a group read instruction, and the explanation on the other part of the configuration is omitted. The control interface section 134 in the present example includes a counter 135 and a data storage section 136.

The counter 135 and the data storage section 136 receive response data in response to the group read instruction, from the bus 140. The counter 135 counts the number of received pieces of response data. Note that an expected value of the number of pieces of data to be read by the group read instruction issued by the corresponding test control section 132 is pre-set to the counter 135.

For example, when the response data is received on each test module 120 basis, the number of test modules 120 designated by a group read instruction can be pre-set to the counter 135 as this expected value. When the response data is received for each test section 210 basis, the number of test sections 210 designated by a group read instruction is pre-set to the counter 135 as the expected value. The counter 135 resets the counted value when the counted value is equal to the expected value, and notifies the data storage section 136 of the incidence.

The data storage section 136 accumulates the received pieces of response data. In response to reception of a notification that the counted value of the counter 135 has become equal to the expected value, the data storage section 136 collectively transmits the accumulated pieces of response data to the test control section 132. During this process, the data storage section 136 deletes the pieces of response data from the storage area after their transmission.

According to the explained configuration, the test control section 132 can collectively read the pieces of response data of the plurality of test modules 120 or of the plurality of test sections 210. In addition, by counting the number of pieces of response data received in response to the corresponding group read instruction, the control interface section 134 can detect completion of reading data from the plurality of designated test modules 120, even without recognizing from which test module 120 particular response data comes from.

Figure 4:
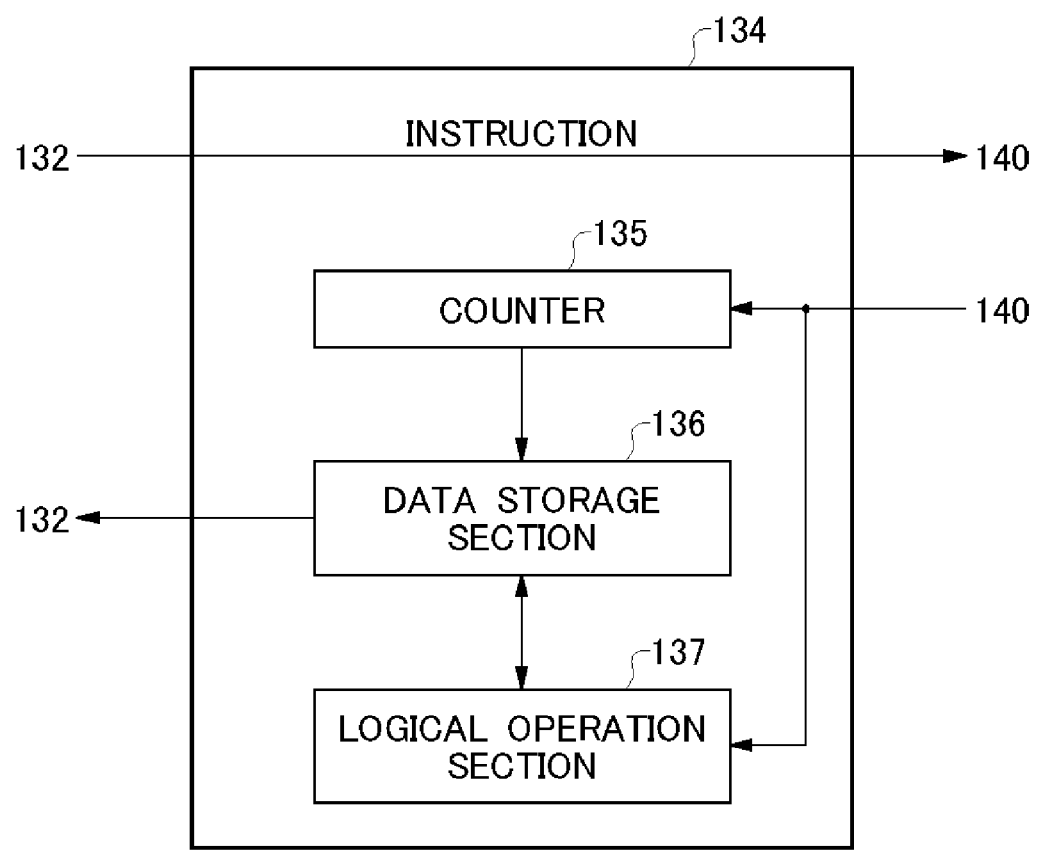
FIG. 4 shows another exemplary configuration of a part of the control interface section 134.

FIG. 4 shows another exemplary configuration of a part of the control interface section 134. In this example, in addition to the configuration of the control interface section 134 shown in FIG. 3, the control interface section 134 further includes a logical operation section 137. The control interface section 134 in the present example notifies the test control section 132 of the logical OR or the logical AND of the pieces of response data received from the test modules 120. The counter 135 has the same function as that of the counter 135 explained with reference to FIG. 3.

Each time response data is received form each test module 120, the logical operation section 137 calculates logical OR or logical AND between the received response data and the already received data. For example, the test control section 132 may issue an instruction to read response data whose logical value is 1 when each test module 120 is in wait state. The test control section 132 may determine when all the designated test modules 120 are brought into wait state. In this case, the logical operation section 137 calculates logical AND between the pieces of response data.

The test control section 132 may also issue an instruction to read response data whose logical value is 1 when the test result of the device under test 10 indicates a failure. The test control section 132 may determine whether the failure of the device under test 10 has been detected in at least one of the designated test modules 120. In this case, the logical operation section 137 calculates logical OR of the pieces of response data.

The data storage section 136 stores the calculation result of the logical operation section 137. Each time new response data is received, the logical operation section 137 reads data from the data storage section 136, performs logical operation (calculation) on the read data and the new response data, and stores the calculation result in the data storage section 136.

When the counted value is equal to the expected value, the counter 135 causes the data value stored in the data storage section 136 to be transmitted to the test control section 132. After the transmission of the data, the data storage section 136 may set the stored data to a default value.

According to the explained configuration, pieces of response data from a plurality of test modules 120 can be transmitted to the test control section 132 in a small transfer amount. In addition, as a result of causing the control interface section 134 to execute the logical operation conventionally carried out by the test control section 132, the processing load on the test control section 132 can be reduced.

Figure 5:
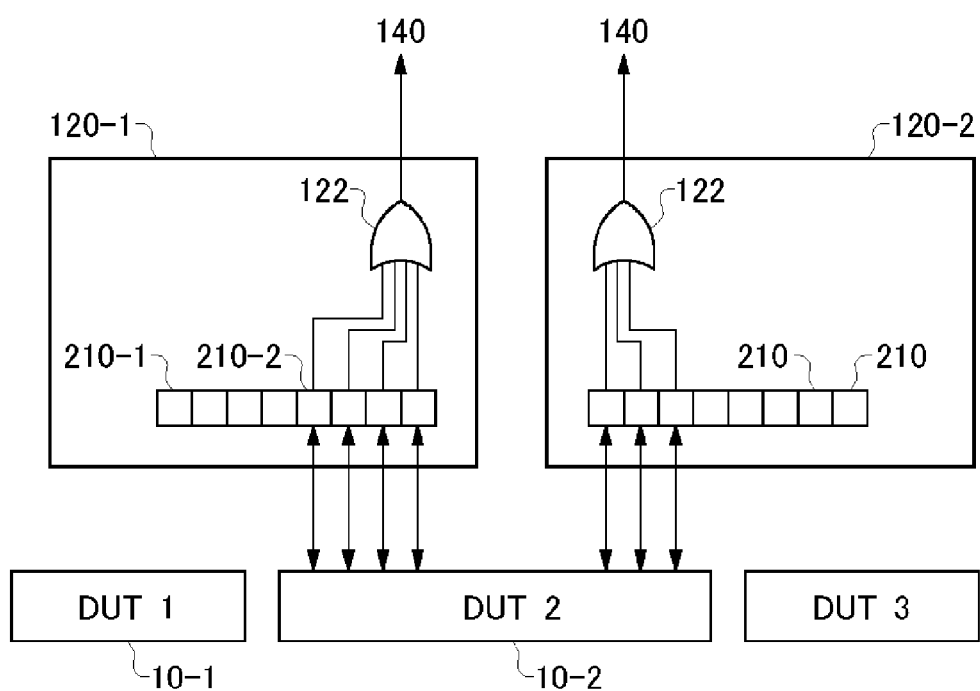
FIG. 5 shows an example of connection between a test section 210 and devices under test 10.

FIG. 5 shows an example of connection between a test section 210 and devices under test 10. In this example, the first test module 120-1 includes at least one first test section 210-1 for exchanging signals with the first device under test 10-1, and at least one second test section 210-2 for exchanging signals with the second device under test 10-2.

When the test control section 132 outputs a group read instruction designating any of the devices under test 10, each test module 120 collectively transmits the pieces of data stored in the one or more test sections 210 corresponding to the device under test 10 designated by the group read instruction. For example, upon reception of a group read instruction designating the second device under test 10-2, the first test module 120-1 collectively transmits the pieces of data stored in the second test section 210-2 from among the plurality of test sections 210.

Here, collective transmission may mean a process to transmit the logical OR or the logical AND of the pieces of data stored in each test section 210. Each test module 120 may include a logical operation section 122 for transmitting, to the bus 140, the logical OR or the logical AND of the pieces of data read from the test section 210 designated by the group read instruction. In this way, by causing the test module 120 to calculate the logical OR or the logical AND of the pieces of response data of the plurality of test sections 210, the processing load for the site control section 130 will be reduced.

Figure 6:
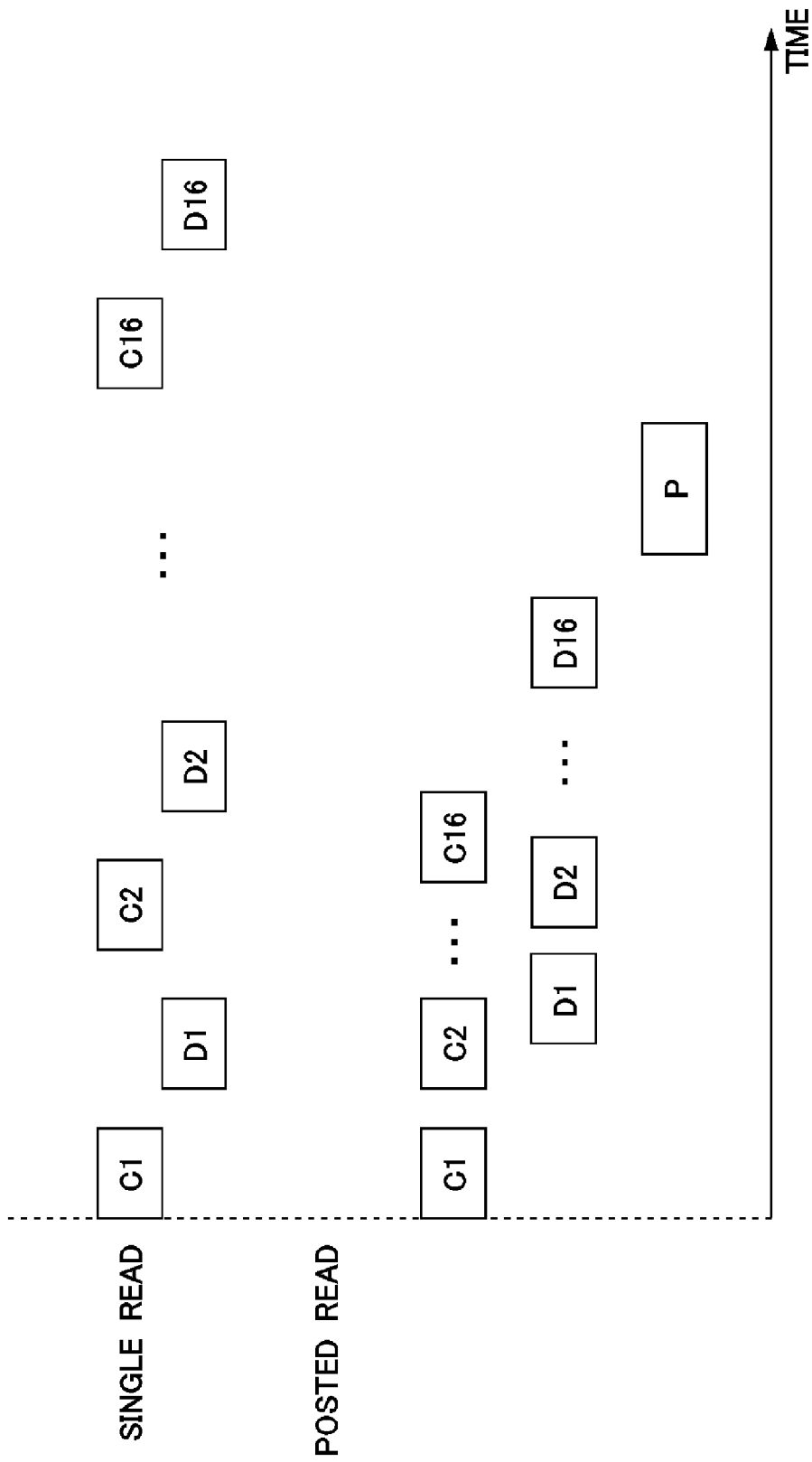
FIG. 6 explains another exemplary operation of the test control section 132.

FIG. 6 explains another exemplary operation of the test control section 132. In this example, the operation of the test control section 132 in issuing a posted read instruction is explained. The posted read instruction is to instruct to sequentially output, to a plurality of test modules 120, individual read instructions that each designate a test module 120 for reading response data therefrom, without waiting for completion of reading of response data from each test module 120.

As shown in FIG. 6, in executing a single read instruction, after completion of reading of response data D from each test module 120, an individual read instruction C designating the next test module 120 is issued. As opposed to this, in the posted read instruction scheme, the test control section 132 sequentially outputs individual read instructions designating test modules 120 respectively, to the bus 140.

The control interface section 134 sequentially outputs pieces of response data corresponding to the individual read instructions respectively. During this process, the control interface section 134 may wait response data transmission to the test control section 132, until reception of the response data from all of the plurality of test modules 120 sequentially designated by the posted read instruction. Upon reception of the pieces of response data from all the designated test modules 120, the control interface section 134 may collectively send the pieces of response data to the test control section 132.

The control interface section 134 may process the pieces of response data by adopting any of the configurations explained with reference to FIG. 3 and FIG. 4. For example, an expected value of the number of test modules 120 designated by a posted read instruction is set to the counter 135.

The counter 135 collectively transmits, to the test control section 132, the pieces of data received from the test modules 120, when the number of pieces of data received from the test module 120 in response to the posted read instruction has matched the set expected value. According to such a control, the test control section 132 can execute a test program before reception of individual pieces of response data.

Figure 7:
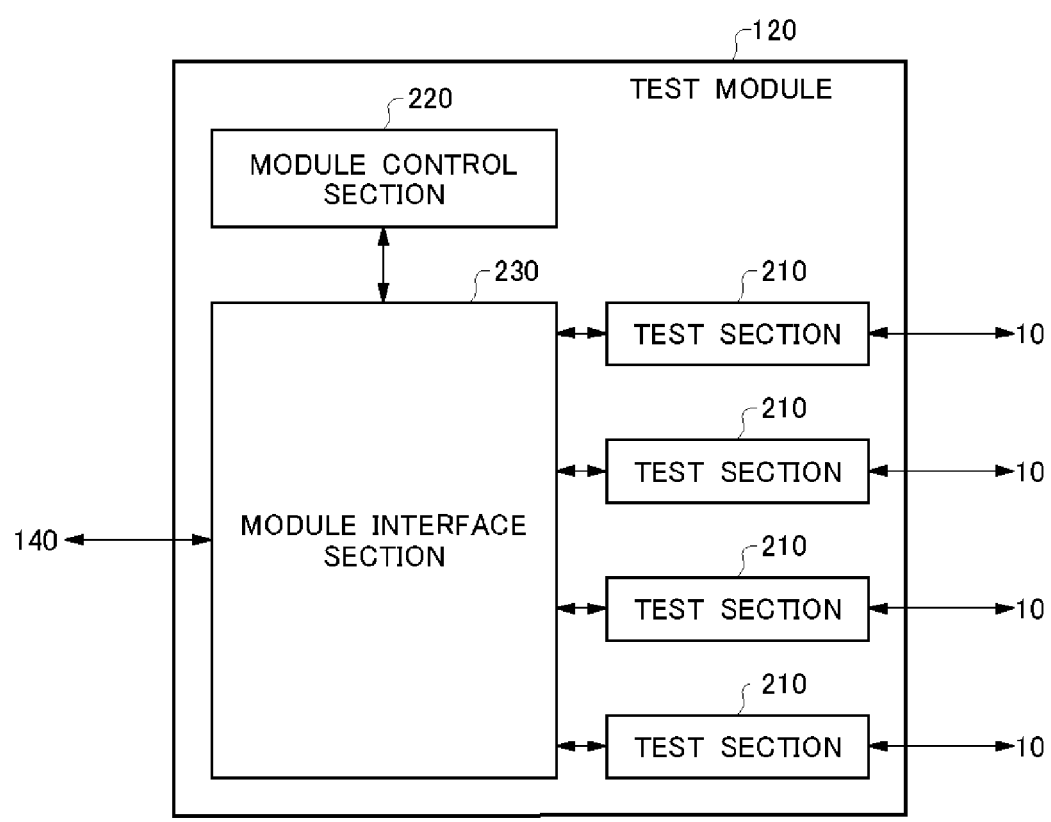
FIG. 7 shows an exemplary configuration of the test module 120.

FIG. 7 shows an exemplary configuration of the test module 120. The test module 120 includes a plurality of test sections 210, a module control section 220, and a module interface section 230.

The module control section 220 stores setting which device under test 10 (or which site control section 130), from among the plurality of site control sections 130, each of the plurality of test sections 210 is to be corresponded with. In this example, the module control section 220 stores identification numbers respectively identifying devices under test 10 which are corresponded to the test sections 210 respectively.

The module control section 220 also stores control data for controlling each test section 210. The mentioned data or settings are written by the test control section 132 prior to conducting a test.

The module interface section 230 is connected to the plurality of test sections 210. Furthermore, the module interface section 230 transceives a read instruction, response data, or the like, with respect to the plurality of site control sections 130 via the bus 140.

Upon reception of a group read instruction designating any of the devices under test 10, the module interface section 230 makes an inquiry to the module control section 220 about whether each of the test sections 210 corresponds to the device under test 10. If there is a test section 210 corresponding to the device under test 10, the module interface section 230 transmits the group read instruction to the test section 210.

In addition, each test module 120 may exchange signals with the other test modules 120, not via the test control section 132. If doing so, the module control section 220 exchanges signals with the module control sections 220 of the other test modules 120.

To be more specific, the module control section 220 transmits signals designating the other test modules 120 to the bus 140. The module control sections 220 of the other test modules 120 may receive the signals via the bus 140.

Each module control section 220 may transmit a synchronous packet to the bus 140, so as to synchronize the corresponding test section 210 with the test sections 210 of the other test modules 120. To be more specific, each module control section 220 generates a synchronous packet when the corresponding test section 210 has been brought to a predetermined wait state.

The control interface section 134 may transmit the received synchronous packet to all the test modules 120 via the bus 140. Note that the control interface section 134 may transmit the synchronous packet received from the module control section 220 to all the test modules 120 corresponding to the same site control section 130.

Figure 8:
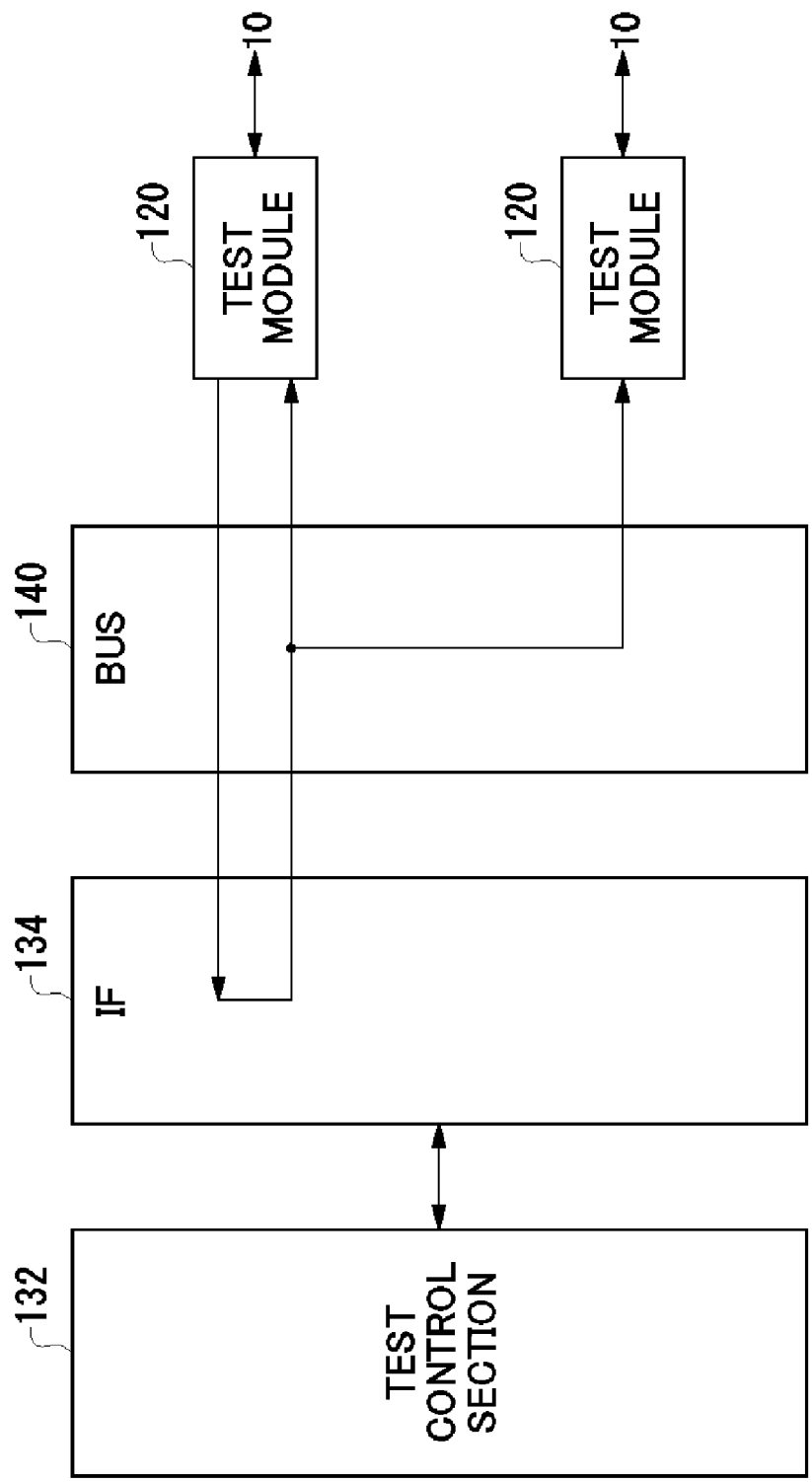
FIG. 8 shows an exemplary packet transfer path for transferring a synchronous packet between test modules 120.

FIG. 8 shows an exemplary packet transfer path for transferring a synchronous packet between test modules 120. A synchronous packet transmitted by one test module 120 is received by a corresponding control interface section 134 via the bus 140. In other words, the module control section 220 transmits a synchronous packet to a corresponding site control section 130.

Upon reception of a signal corresponding to a synchronous packet, the control interface section 134 transmits the synchronous packet to the bus 140, designating all corresponding test modules 120. Upon receiving, from the bus 140, the predetermined number of synchronous packets pre-set by the system control section 110 or the like, each module control section 220 determines that all the test modules 120 to operate in synchronization have been brought into wait state.

Note that each module control section 220 also receives the synchronous packet that it has sent. Therefore, to each module control section 220, the number of test modules 120 including itself is set as the number of synchronous packets to be received.

Then, the module control section 220 causes a corresponding test section 210 to execute the next test item. To be more specific, upon reception of a predetermined number of synchronous packets, each module control section 220 causes the test section 210 to generate the next test signal, and to supply the generated next test signal to the device under test 10.

According to the stated control, even when a time period required for executing each test item is different for each test module 120, a plurality of test modules 120 can be operated in synchronization for each test item. Moreover, the synchronous operation is performed not via the test control section 132, which helps reduce the processing load on the test control section 132.

Figure 9:
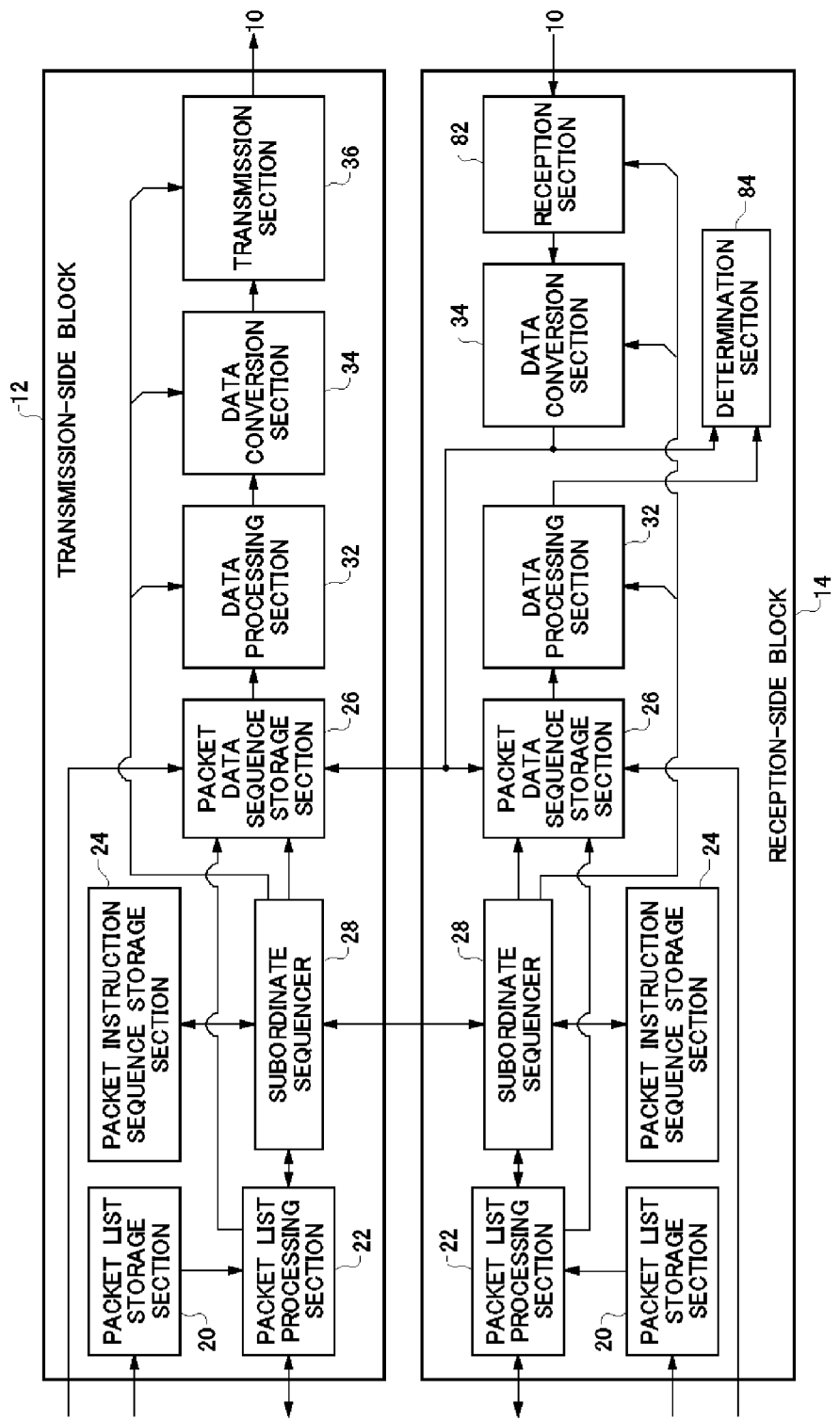
FIG. 9 shows an exemplary configuration of the test section 210.

FIG. 9 shows an exemplary configuration of the test section 210. Note that the test section 210 may have another configuration different from the illustrated configuration. The test section 210 includes a transmission-side block 12 and a reception-side block 14, for example. The test section 210 may have a configuration of having only one of the transmission-side block 12 or the reception-side block 14.

The transmission-side block 12 transmits, to the device under test 10, the packets in the order designated by a packet list. The reception-side block 14 receives a packet from the device under test 10, compares the packets designated in the packet list with the received packet, and determines acceptability of the device under test 10.

The following explains the transmission-side block 12. The transmission-side block 12 includes a packet list storage section 20, a packet list processing section 22, a packet instruction sequence storage section 24, a packet data sequence storage section 26, a subordinate sequencer 28, a data processing section 32, a data conversion section 34, and a transmission section 36. The packet list storage section 20 stores a plurality of packet lists having been supplied.

The packet list processing section 22 executes the packet lists that are stored in the packet list storage section 20 and that are designated from outside, to sequentially designate packets to be exchanged with the device under test 10. For example, the packet list processing section 22 executes a packet list according to the address received from outside, and sequentially designates the packets to transmit to the device under test 10.

For example, the packet list processing section 22 designates the address in the packet instruction sequence storage section 24, which stores the instruction sequence for generating the designated packet. For example, the packet list processing section 22, for a packet to be exchanged with the device under test 10, designates the address (e.g. the first address) of the data sequence included in the packet, within the packet data sequence storage section 26.

In this way, the packet list processing section 22 designates the address of the instruction sequence for generating a packet and the address of the data sequence included in the packet, independently from each other. Note that in this case, when there is a common instruction sequence or a common data sequence designated for two or more packets in a packet list, the packet list processing section 22 may designate, for the two or more packets, the address of the same instruction sequence or the address of the same data sequence.

The packet instruction sequence storage section 24 stores instruction sequences respectively for generating a plurality of types of packets, for each type of packet. For example, the packet instruction sequence storage section 24 stores an instruction sequence for generating a write packet, an instruction sequence for generating a read packet, and an instruction sequence for generating an idle packet.

The packet data sequence storage section 26 stores data sequences respectively included in the plurality of types of packets, for each type of packet. For example, the packet data sequence storage section 26 stores a data sequence included in a write packet, a data sequence included in a read packet, and a data sequence included in an idle packet. In addition, the packet data sequence storage section 26 may store individual data of each packet, and the common data common for each type of packets, in different storage areas from each other, for example.

Furthermore, the transmission-side packet data sequence storage section 26 receives reception data included in the packet received by the reception section 82 in the reception-side block 14, from the data conversion section 34 within the reception-side block 14. Then, the transmission-side packet data sequence storage section 26 stores the reception data included in the packet received by the reception section 82 in the reception-side block 14.

The subordinate sequencer 28 reads the instruction sequence of the packet designated by the packet list processing section 22, i.e. the instruction sequence whose address is designated by the packet list processing section 22, from the packet instruction sequence storage section 24, and sequentially executes each instruction included in the read instruction sequence. Furthermore, the subordinate sequencer 28 causes the packet data sequence storage section 26 to sequentially output, in response to the execution of the instruction sequences, the data sequence of the packet designated by the packet list processing section 22, i.e. the data sequence whose address is designated by the packet list processing section 22, to generate a test data sequence used for a test of the device under test 10.

For each execution of an instruction, the subordinate sequencer 28 supplies, to the data processing section 32 and the data conversion section 34, control data instructing to perform the designated processing (operation or data conversion) to the read individual data and common data. Accordingly, the subordinate sequencer 28 may set the designated part of the data in the packet designated by the packet list processing section 22, as the read data having undergone the designated processing.

The subordinate sequencer 28 may supply a completion notification to the packet list processing section 22, upon completion of the execution of the instruction sequence of the packet designated by the packet list processing section 22. Accordingly, the packet list processing section 22 can sequentially designate packets according to the progress of the execution of instruction sequences in the subordinate sequencer 28.

In addition, the transmission-side subordinate sequencer 28 included in the transmission-side block 12 designates, to the transmission section 36, the edge timing of the signal to be transmitted to the device under test 10. The subordinate sequencer 28 may, for example, supply a timing signal to the transmission section 36, to control the edge timing for each packet.

In addition, the transmission-side subordinate sequencer 28 communicates with the reception-side subordinate sequencer 28 included in the reception-side block 14. Accordingly, the transmission-side subordinate sequencer 28 can handshake with the reception-side subordinate sequencer 28, to execute the instruction sequence in synchronization with the reception-side subordinate sequencer 28.

The transmission-side subordinate sequencer 28 notifies the reception-side subordinate sequencer 28, of completion of transmission of the test data sequence of the pre-designated packet to the device under test 10, for example. Accordingly, the transmission-side subordinate sequencer 28 can prohibit the reception-side subordinate sequencer 28 from determining the acceptability of the received data sequence, for a period until a notification from the transmission-side subordinate sequencer 28 is received.

Upon reception of the notification that the data sequence matching the generated test data sequence is received from the reception-side subordinate sequencer 28, the transmission-side subordinate sequencer 28 generates a test data sequence of the pre-designated packet, for example. Accordingly, the transmission-side subordinate sequencer 28 can transmit the pre-designated packet to the device under test 10, after reception of a predetermined packet from the device under test 10.

The data processing section 32 reads, from the packet data sequence storage section 26, the data sequence of the packet designated by the packet list processing section 22, and generates a test data sequence used for testing the device under test 10. In this case, the transmission-side data processing section 32 may include, within the test data sequence according to the packet to transmit to the device under test 10, a value according to the reception data included in the packet received by the reception section 82 within the reception-side block 14.

For example, the transmission-side data processing section 32 reads data from the transmission-side packet data sequence storage section 26, and generates a test data sequence designating, as the value according to the reception data (e.g. the value of the reception data as it is, or a value resulting from performing certain processing on the reception data), a pre-designated part of the data sequence of the packet to transmit to the device under test 10. The described transmission-side data processing section 32 may transmit the value according to the reception data included in the packet received from the device under test 10, by including it in a packet.

At a timing designated by the subordinate sequencer 28, the data conversion section 34 performs data conversion on the test data sequence outputted from the data processing section 32. For example, the data conversion section 34 performs $8b$-$10b$ conversion by means of a table pre-set to the test data sequence. In another example, the data conversion section 34 may perform scrambling on the test data sequence. Then the data conversion section 34 outputs the converted data sequence. The transmission section 36 transmits, to the device under test 10, the test data sequence generated by the data conversion section 34.

The following explains the reception-side block 14. The reception-side block 14 has substantially the same configuration and function as the transmission-side block 12, and so the following explanation of the reception-side block 14 focuses on the differences from the transmission-side block 12.

The reception-side block 14 includes a packet list storage section 20, a packet list processing section 22, a packet instruction sequence storage section 24, a packet data sequence storage section 26, a subordinate sequencer 28, a data processing section 32, a data conversion section 34, a reception section 82, and a determination section 84. The reception section 82 receives a data sequence of a packet from a device under test 10.

The reception-side data conversion section 34 performs data conversion on the data sequence received by the reception section 82, at a timing designated by the reception-side subordinate sequencer 28. For example, the reception-side data conversion section 34 performs 8b-10b conversion by means of a table pre-set to the received test data sequence. In another example, the reception-side data conversion section 34 may perform descrambling on the received data sequence.

Then, the reception-side data conversion section 34 supplies the converted data sequence to the determination section 84. The reception-side data conversion section 34 may also supply the converted data sequence to at least one of the reception-side packet data sequence storage section 26 or the transmission-side packet data sequence storage section 26.

The reception-side packet list processing section 22 executes the packet lists designated from outside, and sequentially designates the packets expected to be received from the device under test 10. In addition, the reception-side data processing section 32 supplies the generated test data sequence to the determination section 84.

The reception-side subordinate sequencer 28 causes the reception-side packet data sequence storage section 26 to output the data sequence of the packet expected to be outputted from the device under test 10, as the test data sequence. In addition, the reception-side subordinate sequencer 28 designates, to the reception section 82, a strobe timing at which the data value of the signal outputted from the device under test 10 is taken in.

The determination section 84 receives the test data sequence from the reception-side data processing section 32, as well as receiving the data sequence received from the reception-side data conversion section 34. The determination section 84 determines the acceptability of the communication with the device under test 10, based on the result of comparing the received data sequence and the test data sequence. The determination section 84, for example, includes a logic comparing section and a fail memory, where the logic comparing section compares whether the data sequence received by the reception section 82 matches the test data sequence, and the fail memory stores the comparison result. In addition, the determination section 84 may notify the reception-side subordinate sequencer 28 of the matching between the data sequence received by the reception section 82 and the designated data sequence, for example.

In addition, the reception-side subordinate sequencer 28 communicates with the transmission-side subordinate sequencer 28. Accordingly, the reception-side subordinate sequencer 28 can handshake with the transmission-side subordinate sequencer 28, to execute the instruction sequence in synchronization with the transmission-side subordinate sequencer 28.

The reception-side subordinate sequencer 28, for example, notifies the transmission-side subordinate sequencer 28 of reception of the data sequence that matches the test data sequence generated by the reception-side subordinate sequencer 28. Accordingly, the transmission-side subordinate sequencer 28 can generate the test data sequence of a pre-designated packet, upon reception of the notification that the data sequence that matches the generated test data sequence has been received from the reception-side subordinate sequencer 28.

In addition, the reception-side subordinate sequencer 28 prohibits the determination section 84 from determining the acceptability of the data sequence received by the reception section 82, for a period until notification of transmission of the test data sequence of the pre-designated packet to the device under test 10 is received from the transmission-side subordinate sequencer 28. Accordingly, after transmitting a predetermined packet to the device under test 10, the reception-side subordinate sequencer 28 can determine whether a response in response to the predetermined packet has been outputted from the device under test 10.

The reception-side packet data sequence storage section 26 receives reception data included in the packet received by the reception section 82 from the data conversion section 34 in the reception-side block 14. Then, the reception-side packet data sequence storage section 26 stores the reception data included in the packet received by the reception section 82.

Furthermore, the reception-side data processing section 32 incorporates, in the test data sequence included in the packet expected to be outputted from the device under test 10, the value according to the reception data included in the packet already received by the reception section 82. For example, the reception-side data processing section 32 reads the data from the reception-side packet data sequence storage section 26, and generates a test data sequence designating, as the value according to the reception data (e.g. the value of the reception data as it is, or a value resulting from performing certain processing on the reception data), a pre-designated part of the data sequence of the packet expected to be received from the device under test 10.

For example, the reception-side data processing section 32 may incorporate a value according to reception data included in a first packet already received by the reception section 82, within a test data sequence according to a second packet to be received from the device under test 10. Accordingly, the reception-side data processing section 32 can refer to the ID or the like included in the packet received from the device under test 10, for example, so as to determine whether the IDs included in the subsequent packets are valid or not.

As described above, the test apparatus 100 according to the present embodiment can perform, in a position comparatively near the device under test 10, the processing to incorporate, in the subsequent packets, the value according to the reception data included in the received packet. Consequently, the test apparatus 100 can quickly respond to the communication with the device under test 10.

Moreover, the test apparatus 100 should desirably include a data processing section 32 realized by an operation processing unit having a comparatively high operating frequency, for example. By doing so, the test apparatus 100 can quickly perform the processing to generate data to be included in the subsequent packets using the data included in the received packet.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A test apparatus for testing a device under test, comprising:
   a plurality of test modules that exchange signals with the device under test;
   a bus to which the plurality of test modules are connected;
   a test control section that controls the plurality of test modules via the bus; and
   a control interface section provided between the test control section and the bus, wherein
   each of the plurality of test modules includes:
      a test section that exchanges signals with the device under test; and
      a module control section that controls the test section, the module control section operable to transmit to the control interface section, via the bus, a synchronous packet for synchronizing operations of the test section with the test section of another test module, and
   the control interface section is operable to receive the synchronous packet and transmit the received synchronous packet to all the module control sections of the plurality of test modules via the bus.

2. The test apparatus according to claim 1, wherein each module control section is operable to transmit the synchronous packet when the corresponding test section is brought into a predetermined wait state, and to control the corresponding test section to execute a next test item when receiving a predetermined number of synchronous packets from the bus.

3. The test apparatus according to claim 2, wherein each module control section transceives the synchronous packet not via the test control section.

4. The test apparatus according to claim 3, wherein the test control section pre-stores control data for controlling each test section, in a module control section corresponding to the test section.

5. The test apparatus according to claim 1, comprising:
   a plurality of sets of a test control section and a control interface section, wherein
   each test module is controlled by any of the test control sections,
   each module control section is operable to transmit the synchronous packet to a control interface section corresponding to the module control section, and
   each control interface section is operable to transmit the received synchronous packet to a corresponding plurality of module control sections.

6. A test method for testing a device under test using a test apparatus, the test apparatus including: a plurality of test modules that exchange signals with the device under test; a bus to which the plurality of test modules are connected; a test control section that controls the plurality of test modules via the bus; and a control interface section provided between the test control section and the bus, where each of the plurality of test modules includes: a test section that exchanges signals with the device under test; and a module control section that controls the test section, the method comprising:
   controlling the module control section of one or more of the test modules to transmit to the control interface section, via the bus, a synchronous packet for synchronizing operations of the test section corresponding to the module control section with the test section of another test module; and
   controlling the control interface section to receive the synchronous packet and transmit the received synchronous packet to all the module control sections of the plurality of test modules via the bus.

7. The test method according to claim 6 further comprising:
   controlling the one or more of the module control sections to transmit the synchronous packet when the corresponding test section is brought into a predetermined wait state; and
   controlling the corresponding test section to execute a next test item when receiving a predetermined number of synchronous packets from the bus.

* * * * *